(12) United States Patent
Gu

(10) Patent No.: US 11,876,651 B2
(45) Date of Patent: Jan. 16, 2024

(54) DRIVING ADJUSTMENT CIRCUIT AND ELECTRONIC DEVICE

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 113 days.

(21) Appl. No.: 17/720,492

(22) Filed: Apr. 14, 2022

(65) Prior Publication Data
US 2023/0216713 A1 Jul. 6, 2023

(30) Foreign Application Priority Data
Jan. 6, 2022 (CN) .......................... 202210011424.2

(51) Int. Cl.
*H04L 25/03* (2006.01)
*H03K 19/20* (2006.01)
(Continued)

(52) U.S. Cl.
CPC .......... *H04L 25/03114* (2013.01); *G11C 7/10* (2013.01); *H03K 3/037* (2013.01); *H03K 19/20* (2013.01)

(58) Field of Classification Search
CPC ....... H04L 25/03114; G11C 7/10; G11C 7/02; G11C 7/106; G11C 7/1084;
(Continued)

(56) References Cited

U.S. PATENT DOCUMENTS 5,410,510 A * 4/1995 Smith .................. G11C 11/406
365/201
5,757,242 A 5/1998 Chow
(Continued)

FOREIGN PATENT DOCUMENTS

CN 101636905 A 1/2010
CN 104579319 A 4/2015
(Continued)

OTHER PUBLICATIONS

First Office Action of the Chinese application No. 202210011424.2, dated Feb. 15, 2022., 20 pages.
(Continued)

*Primary Examiner* — David S Huang
(74) *Attorney, Agent, or Firm* — Cooper Legal Group, LLC

(57) ABSTRACT

A driving adjustment circuit and an electronic device are provided. The driving adjustment circuit includes a first NOT gate module, second NOT gate module and third NOT gate module sequentially connected. An input terminal of the first NOT gate module and an output terminal of the third NOT gate module are connected to a signal terminal. The first NOT gate module acquires a to-be-driven signal from the signal terminal and perform a NOT operation on the to-be-driven signal to obtain a first adjustment signal. The second NOT gate module receives the first adjustment signal and performing the NOT operation on the first adjustment signal to obtain a second adjustment signal, when the driving adjustment circuit is in an ON state. The third NOT gate module receives the second adjustment signal and perform voltage adjustment processing on the to-be-driven signal at the signal terminal according to the second adjustment signal.

20 Claims, 5 Drawing Sheets

(51) Int. Cl.
*H03K 3/037* (2006.01)
*G11C 7/10* (2006.01)

(58) Field of Classification Search
CPC . G11C 11/4093; G11C 29/022; G11C 29/028; H03K 3/037; H03K 19/20; H03K 19/017; H03K 19/00361
See application file for complete search history.

(56) References Cited

U.S. PATENT DOCUMENTS

| | | | |
|---|---|---|---|
| 5,796,313 | A | 8/1998 | Eitan |
| 6,281,729 | B1 | 8/2001 | Ang |
| 7,212,460 | B1 * | 5/2007 | Jung .................. G11C 11/4091 365/207 |
| 7,719,307 | B2 | 5/2010 | Lee |
| 7,733,708 | B2 | 6/2010 | Choi |
| 10,158,354 | B2 | 12/2018 | Dutta et al. |
| 10,476,516 | B1 | 11/2019 | Chuai et al. |
| 11,031,054 | B1 | 6/2021 | Arai |
| 2002/0105356 | A1 | 8/2002 | Genna |
| 2005/0216623 | A1 | 9/2005 | Dietrich |
| 2007/0153591 | A1 | 7/2007 | Choi |
| 2008/0129561 | A1 | 6/2008 | Shim |
| 2008/0231322 | A1 | 9/2008 | Mohammad et al. |
| 2009/0167344 | A1 | 7/2009 | Lee |
| 2010/0061157 | A1 | 3/2010 | Lee |
| 2011/0007591 | A1 | 1/2011 | Lee |
| 2012/0105107 | A1 | 5/2012 | Moon |
| 2013/0335152 | A1 | 12/2013 | Burnette |
| 2015/0123826 | A1 | 5/2015 | Lee et al. |
| 2015/0303930 | A1 | 10/2015 | Chen |
| 2018/0123593 | A1 | 5/2018 | Choi |

FOREIGN PATENT DOCUMENTS

| | | |
|---|---|---|
| CN | 108418577 A | 8/2018 |
| CN | 111030703 A | 4/2020 |
| CN | 113162653 A | 7/2021 |
| CN | 114024544 A | 2/2022 |
| JP | 2006060690 A | 3/2006 |
| KR | 20180049483 A | 5/2018 |
| WO | 2021258963 A1 | 12/2021 |

OTHER PUBLICATIONS

First Office Action of the Chinese application No. 202210011419.1, dated Feb. 15, 2022, 17 pages.
Zhuang Yiqi, "Electronic design reliability engineering" Xidian University Press, Sep. 30, 2014, p. 202-p. 206.
Sun Lihua, "Digital Electronic Technology Application Tutorial", Huazhong University of Science and Technology Press, Sep. 30, 2018, p. 29-p. 33.
Second Office Action of the Chinese application No. 202210011424.2, dated Mar. 11, 2022, 10 pages.
Third Office Action of the Chinese application No. 202210011419.1, dated Mar. 31, 2022, 19 pages.
"Realization of Fully Differential Low Voltage and High Drive Operational Amplifier", Jun. 2006, Jiang Jingguang and Wang Yaonan, Journal of Electronic Measurement and Instrument, vol. 20 No. 3, p. 43-p. 46.
"High Output Swing Monolithic Inverter with E-D Mode MIS-HEMTs for GaN Power Integrated Circuits", Jun. 2015, Yun-Hsiang Wang, Yung C. Liang, Ganesh S. Samudra, Bo-Jhang Huant, Ya-Chu Liao, Chi-Fang Huang Wei-Hung Kuo and Guo-Qiang Lo, IEEE Peds 2015, Sydney, Australia, p. 585-p. 588.

* cited by examiner

DRIVING ADJUSTMENT CIRCUIT AND ELECTRONIC DEVICE

CROSS-REFERENCE TO RELATED APPLICATION

This Application is based upon and claims the benefit of priority to Chinese Patent Application No. 202210011424.2, filed on Jan. 6, 2022, the contents of which are incorporated herein by reference in their entirety for all purposes.

BACKGROUND

With the development of industry, it is desirable to further increase an operating rate of an electronic device, i.e., an operating frequency of the electronic device. In order to achieve this purpose, a signal transmission rate in the electronic device need to be higher. However, when the operating frequency is higher, the problem of inter-symbol interference is likely to occur during signal transmission, which limits development of the electronic device.

SUMMARY

The present disclosure relates to the technical field of semiconductor memory, and in particular to a driving adjustment circuit and an electronic device.

According to a first aspect, at least one embodiment of the present disclosure provides a driving adjustment circuit. The driving adjustment circuit includes a first NOT gate module, a second NOT gate module, and a third NOT gate module that are sequentially connected, wherein an input terminal of the first NOT gate module and an output terminal of the third NOT gate module are connected to a signal terminal; wherein the first NOT gate module is configured to acquire a to-be-driven signal from the signal terminal and perform a NOT operation on the to-be-driven signal to obtain a first adjustment signal; the second NOT gate module is configured to, under the condition that the driving adjustment circuit is in an ON state, receive the first adjustment signal and perform the NOT operation on the first adjustment signal to obtain a second adjustment signal; the third NOT gate module is configured to receive the second adjustment signal and perform voltage adjustment processing on the to-be-driven signal at the signal terminal according to the second adjustment signal.

According to a second aspect, at least one embodiment of the present disclosure provides an electronic device including a signal terminal and a driving adjustment circuit, the driving adjustment circuit includes a first NOT gate module, a second NOT gate module, and a third NOT gate module that are sequentially connected, wherein an input terminal of the first NOT gate module and an output terminal of the third NOT gate module are connected to a signal terminal; wherein the first NOT gate module is configured to acquire a to-be-driven signal from the signal terminal and perform a NOT operation on the to-be-driven signal to obtain a first adjustment signal; the second NOT gate module is configured to, under the condition that the driving adjustment circuit is in an ON state, receive the first adjustment signal and perform the NOT operation on the first adjustment signal to obtain a second adjustment signal; and the third NOT gate module is configured to receive the second adjustment signal and perform voltage adjustment processing on the to-be-driven signal at the signal terminal according to the second adjustment signal

DETAILED DESCRIPTION

Figure 1:
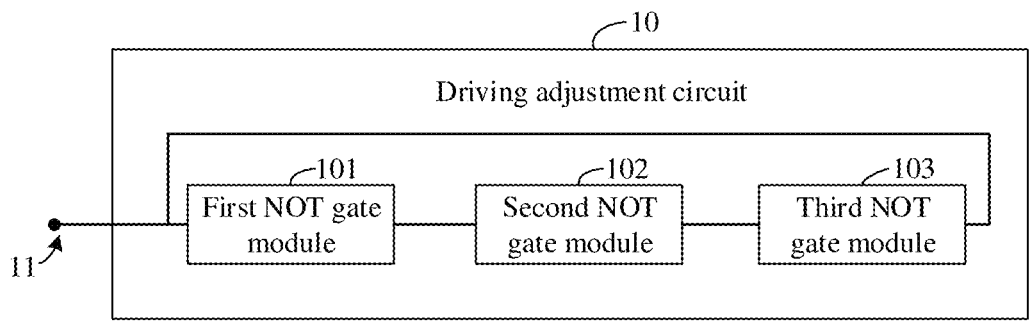
FIG. 1 is a schematic structural diagram of a driving adjustment circuit according to at least one embodiment of the present disclosure.

The following describes the technical solutions of the embodiments of the present disclosure clearly and completely with reference to the accompanying drawings in the embodiments of the present disclosure. It will be appreciated that the specific embodiments described herein are intended only to explain the relevant application and not to limit the application. It should also be noted that, for ease of description, only parts related to the related application are shown in the drawings.

Unless otherwise defined, all technical and scientific terms used herein have the same meanings as those skilled in the art of the present disclosure generally understand. The terms used herein are for the purpose of describing embodiments of the present disclosure only and are not intended to limit the present disclosure.

The following descriptions are made reference to some embodiments, which describe a subset of all possible embodiments. But it is to be understood that some embodiments may be the same subset or different subsets of all possible embodiments, and may be combined with each other without conflict.

It is to be noted that the term "first/second/third" in embodiments of the present disclosure is merely for distinguishing similar objects and does not represent a specific order of objects. It is to be understood that the "first/second/third" may be interchanged in a particular order or sequence, if permitted, so that the embodiments of the present disclosure described herein can be implemented in a sequence other than that illustrated or described herein.

English abbreviations involved in embodiments of the present disclosure will be explained.

DRAM (Dynamic Random Access Memory);
SRAM (Static Random-Access Memory);
SDRAM (Synchronous Dynamic Random Access Memory);
DDR (Double Data Rate SDRAM);
DDR4: Technical Standard of DDR 4;
DDR5: Technical Standard of DDR 5;
Mbps (Million bits per second);
4-1 MUX: 4-to-1 multiplexer.

DDR is a core memory device in an electronic device. Compared to DDR4, a data transmission rate of DDR5 increases from 3200 Mbps to 6400 Mbps. However, there are some limitations in a data transmission process in the related art, and inter-symbol interference ISI occurs to a high-speed data transmission, which limits the development of the electronic device.

During the data transmission process, parallel data needs to be converted into serial data through a data selector (e.g., the 4-1 MUX), thereby realizing a serialized output. Meanwhile, the higher the data transmission rate is, the greater load pressure of the data selector is, so that the data selector is one of bottlenecks for limiting the transmission rate.

At least one embodiment of the present disclosure provides a driving adjustment circuit. The driving adjustment circuit includes a first NOT gate module, a second NOT gate module, and a third NOT gate module that are sequentially connected. Here, an input terminal of the first NOT gate module and an output terminal of the third NOT gate module are connected to a signal terminal. Here, the first NOT gate module is configured to acquire a to-be-driven signal from the signal terminal and perform a NOT operation on the to-be-driven signal to obtain a first adjustment signal; the second NOT gate module is configured to, under the condition that the driving adjustment circuit is in an ON state, receive the first adjustment signal and perform the NOT operation on the first adjustment signal to obtain a second adjustment signal; the third NOT gate module is configured to receive the second adjustment signal and perform voltage adjustment processing on the to-be-driven signal at the signal terminal according to the second adjustment signal. Thus, by performing the voltage adjustment processing on the to-be-driven signal, signal transmission performance can be improved, the inter-symbol interference problem can be partially solved, and the data transmission rate can be improved.

Embodiments of the present disclosure will be described in detail below with reference to the accompanying drawings.

In at least one embodiment of the present disclosure, referring to FIG. 1, which shows a schematic structural diagram of a driving adjustment circuit 10 according to at least one embodiment of the present disclosure. As shown in FIG. 1, the driving adjustment circuit may include a first NOT gate module 101, a second NOT gate module 102, and a third NOT gate module 103 that are sequentially connected. An input terminal of the first NOT gate module 101 and an output terminal of the third NOT gate module 103 are connected to a signal terminal 11. The first NOT gate module 101 is configured to acquire a to-be-driven signal from the signal terminal and perform a NOT operation on the to-be-driven signal to obtain a first adjustment signal. The second NOT gate module 102 is configured to, under the condition that the driving adjustment circuit 10 is in an ON state, receive the first adjustment signal and perform a NOT operation on the first adjustment signal to obtain a second adjustment signal. The third NOT gate module 103 is configured to receive the second adjustment signal and perform voltage adjustment processing on the to-be-driven signal at the signal terminal according to the second adjustment signal.

It is to be noted that the driving adjustment circuit in the embodiments of the present disclosure is applied to various types of electronic devices, which may be a smartphone, a tablet computer, a palmtop computer, a Mobile Terminal, or the like. The embodiments of the present disclosure are merely examples and do not constitute related limitations.

For example, a parallel signal output from a memory (e.g., DRAM, SRAM, or SDRAM) in the electronic device needs to be converted into a serial signal through a data selector, and the process tends to limit an improvement in an operating frequency of the electronic device, so that a driving adjustment circuit 10 may be provided at the data selector. In this way, in a data transmission process, through the driving adjustment circuit 10, signal transmission performance is improved, and a signal transmission rate is improved, so as to solve an inter-symbol interference problem between signals.

As shown in FIG. 1, the driving adjustment circuit includes three end-to-end NOT gate modules, and the input terminal of the first NOT gate module 101 and the output terminal of the third NOT gate module 103 are connected to the signal terminals 11. That is, under the condition that the driving adjustment circuit 10 is in the ON state, the first NOT gate module 101, the second NOT gate module 102, and third NOT gate module 103 form a path to charge or discharge the signal terminal 11 to adjust a voltage value of the to-be-driven signal at the signal terminal 11.

In some embodiments, the third NOT gate module 103 is specifically configured to perform voltage pull-down processing on a first voltage value to obtain a second voltage value, and perform voltage pull-up processing on a third voltage value to obtain a fourth voltage value.

Here, the first voltage value and the second voltage value are both within a first level range, the second voltage value is less than the first voltage value, the third voltage value and the fourth voltage value are both within a second level range, the fourth voltage value is greater than the third voltage value, and each voltage value within the first level range is greater than any voltage value within the second level range.

It is to be noted that the first level range and the second level range respectively represent level ranges of different logic signals. For example, the first level range may be a level range of a logic "1" signal and the second level range may be a level range of a logic "0" signal. That is, the first voltage value refers to the logic "1" signal in the to-be-driven signal, and the third voltage value refers to the logic "0" signal.

Thus, after the driving adjustment circuit 10 is turned on, the third NOT gate module 103 can perform the voltage pull-down the logic "1" signal in the to-be-driven signal and perform the voltage pull-up the logic "0" signal in the to-be-driven signal. Thus, through the voltage adjustment processing, a voltage difference between the logic "1" signal and the logic "0" signal in the to-be-driven signal is reduced, and charging and discharging of a device or a node in an electric circuit requires less time, which may transmit a signal backwards faster, thereby improving the signal transmission performance.

It is to be understood that the logic "1" signal that has undergone the voltage pull-down processing still belongs to the first level range, that is, the voltage pull-down processing does not cause the logic "1" signal to become the logic "0" signal. Similarly, the logic "0" signal that has undergone the voltage pull-up processing still belongs to the second level range, that is, the voltage pull-up processing does not cause the logic "0" signal to become the logic "1" signal.

As described above, after the driving adjustment circuit 10 is turned on, the third NOT gate module 103 performs the voltage adjustment processing on the to-be-driven signal to improve the transmission performance of the to-be-driven signal and speed up backward transmission of the to-be-driven signal, thereby solving the inter-symbol interference problem and improving an operating frequency of the electronic device.

It is to be noted that when the data transmission rate required by the electronic device is not high, the driving adjustment circuit 10 may be selected to be turned off, thereby reducing current to reduce power consumption. Thus, in some embodiments, the second NOT gate module 102 is further configured to receive an enable signal and control the driving adjustment circuit 10 to be in the ON state or in an OFF state according to the enable signal.

It to be noted that the second NOT gate module 102 is further configured as a gate control module of the driving adjustment circuit 10, which is configured to determine whether to turn off the driving adjustment circuit 10 or to turn on the driving adjustment circuit 10 according to the received enable signal.

In some embodiments, the enable signal may include a first enable signal EN and a second enable signal ENB. The second NOT gate module 102 is further configured to control the driving adjustment circuit 10 to be in the ON state when the first enable signal EN is within the first level range and the second enable signal ENB is within the second level range, or control the driving adjustment circuit 10 to be in the OFF state when the first enable signal EN is within the second level range and the second enable signal ENB is within the first level range.

It is to be noted that the first level range is used to indicate the logic "1" signal and the second level range is used to indicate the logic "0" signal hereinafter for explanation, which however does not constitute related limitations.

For example, the first enable signal EN and the second enable signal ENB are a pair of signals having opposite levels. When the first enable signal EN is logic "1" and the second enable signal ENB is logic "0", the second NOT gate module 102 is turned on and the driving adjustment circuit 10 is in the ON state. When the first enable signal EN is the logic "0" and the second enable signal ENB is the logic "1", the second NOT gate module 102 is turned off and the driving adjustment circuit 10 is in the OFF state.

In this way, when the transmission rate is high, the driving adjustment circuit 10 can be turned on, so that the driving adjustment circuit 10 performs the voltage adjustment processing on the to-be-driven signal at the signal terminal 11, thereby improving the signal transmission performance and increasing the signal transmission rate. When the transmission rate is low, the driving adjustment circuit 10 can be turned off, thereby reducing the current and reducing the power consumption.

It is to be noted that, when the driving adjustment circuit 10 performs the voltage adjustment processing, an amplitude of the driving adjustment circuit 10 needs to correspond to the transmission rate of the electronic device. Therefore, in some embodiments, the third NOT gate module 103 is further configured to receive a control signal and perform a first voltage pull-down processing on the first voltage value and a first voltage pull-up processing on the third voltage value according to the control signal, or perform a second voltage pull-down processing on the first voltage value according to the control signal and a second voltage pull-up processing on the third voltage value.

Here, a voltage pull-down rate in the first voltage pull-down processing is greater than a voltage pull-down rate in the second voltage pull-down processing, and a voltage pull-up rate in the first voltage pull-up processing is greater than a voltage pull-up rate in the second voltage pull-up processing.

It is to be noted that the driving adjustment circuit 10 provides at least two operation modes: performing the first voltage pull-up processing and the first voltage pull-down processing on the to-be-driven signal at a relatively high rate and a relatively large amplitude, hereinafter referred to as a first operation mode; or performing the second voltage pull-up processing and the second voltage pull-down processing at a relatively low rate and a relatively small amplitude, hereinafter referred to as a second operation mode.

In addition, switching of the two operation modes is controlled by the third NOT gate module 103. That is, the third NOT gate module 103 is further configured to receive the control signal and determine the operation mode of the driving adjustment circuit 10 according to the control signal.

Figure 2:
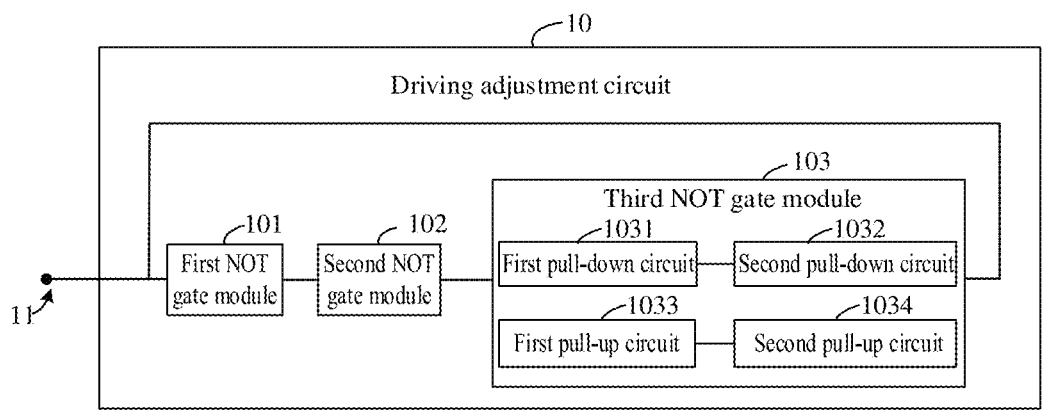
FIG. 2 is a schematic structural diagram of another driving adjustment circuit according to at least one embodiment of the present disclosure.

In some embodiments, referring to FIG. 2, FIG. 2 shows a schematic structural diagram of another driving adjustment circuit 10 according to at least one embodiment of the present disclosure. As shown in FIG. 2, the control signal includes a first control signal CTRL and a second control signal CTRL_B. The third NOT gate module 103 may include a first pull-down circuit 1031 and a second pull-down circuit 1032. The third NOT gate module 103 is further configured to, under the condition that the first control signal CTRL is within the first level range and the second control signal CTRL_B is within the second level range, perform the first voltage pull-down processing on the first voltage value through the first pull-down circuit 1031 and the second pull-down circuit 1032 to obtain the second voltage value. Or the third NOT gate module is further configured to, under the condition that the first control signal CTRL is within the second level range and the second control signal CTRL_B is within the first level range, perform the second voltage pull-down processing on the first voltage value through the first pull-down circuit 1031 to obtain the second voltage value.

Similarly, in some embodiments, as shown in FIG. 2, the third NOT gate module 103 may further include a first pull-up circuit 1033 and a second pull-up circuit 1034. The third NOT gate module 103 is further configured to, under the condition that the first control signal CTRL is within the first level range and the second control signal CTRL_B is within the second level range, perform the first voltage pull-up processing on the third voltage value through the first pull-up circuit 1033 and the second pull-up circuit 1034 to obtain the fourth voltage value. Or the third NOT gate module is further configured to, under the condition that the first control signal CTRL is within the second level range and the second control signal CTRL_B is within the first level range, perform the second voltage pull-up processing on the third voltage value through the first pull-up circuit 1033 to obtain the fourth voltage value.

It is to be noted that the first control signal CTRL and the second control signal CTRL_B are a pair of signals having opposite levels.

For example, when the first control signal CTRL is the logic "1" and the second control signal CTRL_B is the logic "0", the driving adjustment circuit 10 enters into the first operation mode, and all of the first pull-down circuit 1031, the second pull-down circuit 1032, the first pull-up circuit 1033, and the second pull-up circuit 1034 are turned on, so that through two pull-up circuits performing the voltage pull-up processing and two pull-down circuits performing the voltage pull-down processing, a voltage adjustment rate is high and a voltage pull-up/pull-down amplitude is large.

When the first control signal CTRL is the logic "0" and the second control signal CTRL_B is the logic "1", the driving adjustment circuit 10 enters into the second operation mode, the first pull-down circuit 1031 and the first pull-up circuit 1033 are turned on, and the second pull-down circuit 1032 and the second pull-up circuit 1034 are turned off, so that through one pull-up circuit performing the voltage pull-up processing and one pull-down circuits performing the voltage pull-down processing, the voltage adjustment rate is low and the voltage pull-up/pull-down amplitude is large.

Thus, under the condition that the driving adjustment circuit 10 is turned on, the rate and amplitude of the voltage adjustment processing can also be controlled by the first control signal/the second control signal to better match the transmission rate of the electronic device.

As can be seen from the above, for the driving adjustment circuit 10, the operation mode of the driving adjustment circuit 10 can be determined according to the received enable signal and the control signal, so that corresponding processing on the drive signal is performed. A specific processing procedure of the to-be-driven signal is given below.

In some embodiments, the first NOT gate module 101 is specifically configured to output the first adjustment signal within the second level range under the condition that the to-be-driven signal is within the first level range, or output the first adjustment signal within the first level range under the condition that the to-be-driven signal is within the second level range.

It is to be noted that the first NOT gate module 101 performs the NOT operation on the to-be-driven signal to obtain the first adjustment signal different from the level range of the to-be-driven signal.

In some embodiments, the second adjustment signal includes a second first adjustment signal and a second second adjustment signal. Accordingly, the second NOT gate module 102 is further configured to, when the driving adjustment circuit 10 is in the ON state, receive the first adjustment signal within the first level range and output the second first adjustment signal within the second level range and the second second adjustment signal within the second level range. Or the second NOT gate module is further configured to, when the driving adjustment circuit is in the ON state, receive when the driving adjustment circuit 10 is in the ON state, receive the first adjustment signal within the second level range and output the second first adjustment signal within the first level range and the second second adjustment signal within the first level range are output.

It is to be noted that when the enable signal is active (the first enable signal EN is within the first level range and the second enable signal ENB is within the second level range), the second NOT gate module 102 receives the first adjustment signal and outputs a pair of the second adjustment signals having the same level state according to the first adjustment signal. In other words, the level ranges of both the second first adjustment signal and the second second adjustment signal are opposite to the level range of the first adjustment signal, while the level range of both the second first adjustment signal and the second second adjustment signal are same as the level range of the to-be-driven signal.

In some embodiments, the third NOT gate module 103 is further configured to, when the second first adjustment signal within the first level range and the second second adjustment signal within the first level range are received, determine a voltage of the to-be-driven signal as the first voltage value. Or the third NOT gate module 103 is further configured to, when the second first adjustment signal within the second level range and the second second adjustment signal within the second level range are received, determine the voltage of the to-be-driven signal as the third voltage value.

It is to be noted that the third NOT gate module 103 determines a voltage condition of the to-be-driven signal according to the received second first adjustment signal and the received second second adjustment signal, and determines the rate and amplitude at which the voltage adjustment processing is performed on the to-be-driven signal according to the received control signal. If the third NOT gate module 103 determines that the voltage of the to-be-driven signal is the first voltage value, the third NOT gate module 103 performs the voltage pull-down processing on the to-be-driven signal. If the third NOT gate module 103 determines that the voltage of the to-be-driven signal is the third voltage value, the third NOT gate module 103 performs the voltage pull-up processing on the to-be-driven signal.

Here, the pull-up circuit has an external power source to perform the voltage pull-up processing on the to-be-driven signal by using the power source, and the pull-down circuit has a ground terminal to perform the voltage pull-down processing on the to-be-driven signal by using a ground signal.

It is to be noted that in an actual application scenario, the to-be-driven signal is a sequence signal. At this time, the driving adjustment circuit 10 performs the voltage pull-down processing on the logic "1" (the first voltage value) in the to-be-driven signal, and performs the voltage pull-up processing on the logic "0" (the second voltage value) in the to-be-driven signal. For convenience of description, in the embodiment of the present disclosure, only the to-be-driven signal at a certain time is taken as an object to explain, that is, the to-be-driven signal is the logic "1" or the logic "0".

For example, in the first operation mode, if the to-be-driven signal is the logic "1", the first NOT gate module outputs the logic "0" (the first adjustment signal), and the second NOT gate module outputs the logic "1". At this time, the third NOT gate module receives the second first adjustment signal (the logic "1"), the second second adjustment signal (the logic "1"), the first control signal (the logic "1"), and the second control signal (the logic "0"), so that the first pull-down circuit 1031 and the second pull-down circuit 1032 are turned on, and the first voltage pull-down processing is performed on the to-be-driven signal. If the to-be-driven signal is a logic "0", the first NOT gate module outputs the logic "1" (the first adjustment signal), and the second NOT gate module outputs the logic "0" (the second first adjustment signal and the second second adjustment signal). At this time, the third NOT gate module receives the second first adjustment signal (the logic "0"), the second second adjustment signal (the logic "0"), the first control signal (the logic "1"), and the second control signal (the logic "0"), so that the first pull-up circuit 1033 and the second pull-up circuit 1034 are turned on, and the first voltage pull-up processing is performed on the to-be-driven signal.

In the second operation mode, if the to-be-driven signal is the logic "1", the first NOT gate module outputs the logic "0" (the first adjustment signal), and the second NOT gate module outputs the logic "1" (the second first adjustment signal and the second second adjustment signal). At this time, the third NOT gate module receives the second first adjustment signal (the logic "1"), the second second adjustment signal (the logic "1"), the first control signal (the logic "0"), and the second control signal (the logic "1"), so that the first pull-down circuit 1031 is turned on, the second pull-down circuit 1032 is turned off, and the second voltage pull-down processing is performed on the to-be-driven signal. If the to-be-driven signal is the logic "0", the first NOT gate module outputs the logic "1" (the first adjustment signal), and the second NOT gate module outputs the logic "0" (the second first adjustment signal) and the logic "1" (the second second adjustment signal). At this time, the third NOT gate module receives the second first adjustment signal (the logic "0"), the second second adjustment signal (the logic "0"), the first control signal (the logic "0"), and the second control signal (the logic "1"), so that the first pull-up circuit 1033 is turned on, the second pull-up circuit 1034 is turned off, and the second voltage pull-up processing is performed on the to-be-driven signal. In this way, the three NOT gate modules can perform the voltage adjustment on the to-be-driven signal, improve the signal transmission performance, and partially solves the inter-symbol interference problem of the signal. In addition, the ON/OFF state of the driving adjustment circuit 10 can be changed by the enable signal, and the operation mode of the driving adjustment circuit 10 can be changed by the control signal, thereby providing a multi-level control strategy to better match the transmission rate of the electronic device.

In some embodiments, the driving adjustment circuit 10 may further include an adjustment control module. The adjustment control module is configured to receive a mode encoding signal and output the first enable signal EN, the second enable signal ENB, the first control signal CTRL, and the second control signal CTRL_B according to the mode encoding signal.

It is to be noted that the adjustment control module is configured to receive the mode encoding signal transmitted by a front end circuit. The mode encoding signal is used to indicate whether or not the driving adjustment circuit 10 is enabled, and under the condition that the driving adjustment circuit 10 is enabled, indicate which operation mode of the driving adjustment circuit 10 is enabled. Specifically, the adjustment control module outputs the enable signal and the control signal according to the received mode encoding signal.

For the electronic device, a first transmission threshold value and a second transmission threshold value may be determined, and a data transmission rate may be classified into three types including a high rate, a medium rate, and a low rate according to the first transmission threshold value and the second transmission threshold value.

In some embodiments, the mode encoding signal may include a first type of encoding signal, and the first type of encoding signal is used to indicate that the data transmission rate of the electronic device is greater than the first transmission threshold value.

Accordingly, the adjustment control module is configured to, when the first type of encoding signal is received, control the first enable signal EN to be within the first level range and the second enable signal ENB to be within the second level range to control the driving adjustment circuit 10 to be in the ON state; and the adjustment control module is configured to control the first control signal CTRL to be within the first level range and the second control signal CTRL_B to be within the second level range, such that the driving adjustment circuit 10 performs the first voltage pull-down processing or the first voltage pull-up processing.

In this way, when the electronic device is at the high rate (that is, the data transmission rate is greater than the first transmission threshold value), the driving adjustment circuit 10 is controlled to perform level adjustment processing (the first voltage pull-up processing/the first voltage pull-down processing) on the to-be-driven signal at a relatively high rate and a relatively large amplitude, thereby maximally improving the signal transmission performance and solving the inter-symbol interference problem of the signal.

In some embodiments, the mode encoding signal may include a second type of encoding signal, and the second type of encoding signal is used to indicate that the data transmission rate of the electronic device is greater than the second transmission threshold value and less than or equal to the first transmission threshold value. Accordingly, the adjustment control module is configured to, when the second type of encoding signal is received, control the first enable signal EN to be within the first level range and the second enable signal ENB to be within the second level range to control the driving adjustment circuit 10 to be in the ON state; and the adjustment control module is configured to control the first control signal CTRL to be within the second level range and the second control signal CTRL_B to be within the first level range, such that the driving adjustment circuit 10 performs the second voltage pull-down processing or the second voltage pull-up processing.

In this way, when the electronic device is at the medium rate (that is, the data transmission rate is greater than the second transmission threshold value and is less than or equal to the first transmission threshold value), the driving adjustment circuit 10 is controlled to perform the level adjustment processing (the second voltage pull-up processing/the second voltage pull-down processing) on the to-be-driven signal at a relatively slow rate and a relatively small amplitude, thereby improving the signal transmission performance partially, improving the inter-symbol interference problem of the signal, and taking the power consumption of the electronic device into the consideration.

In some embodiments, the mode encoding signal may further include a third type of encoding signal, and the third type of encoding signal is used to indicate that the data transmission rate of the electronic device is less than or equal to the second transmission threshold value. Accordingly, the adjustment control module is configured to, when the third type of encoding signal is received, control the first enable signal EN to be within the second level range and the second enable signal ENB to be within the first level ranges to control the driving adjustment circuit 10 to be in the OFF state.

Thus, when the electronic device is at the low rate (i.e., the data transmission rate is less than or equal to the second transmission threshold value), the driving adjustment circuit 10 is turned off to reduce the current and save the power consumption while ensuring the data transmission performance.

For example, the mode encoding signal may be associated with a parameter indicative of an operating frequency that already exists in the electronic device. Taking an electronic device containing DRAMs as an example, the mode encoding signal may be determined according to a t_CCDL parameter.

Here, specific values of the first transmission threshold value and the second transmission threshold value need to be determined according to an actual application scenario, which is not limited in this embodiment of the present disclosure. For example, the first transmission threshold value is 5,600 megabits per second and the second transmission threshold value is 4,800 megabits per second.

The control logic and the signal processing logic of the driving adjustment circuit 10 have been described in detail in the foregoing embodiment, and a specific driving adjustment circuit 10 may be formed by combining a plurality of basic electrical devices. A specific configuration of an exemplary driving adjustment circuit 10 is given below, but this is not a limitation of the present disclosure embodiment.

Figure 3:
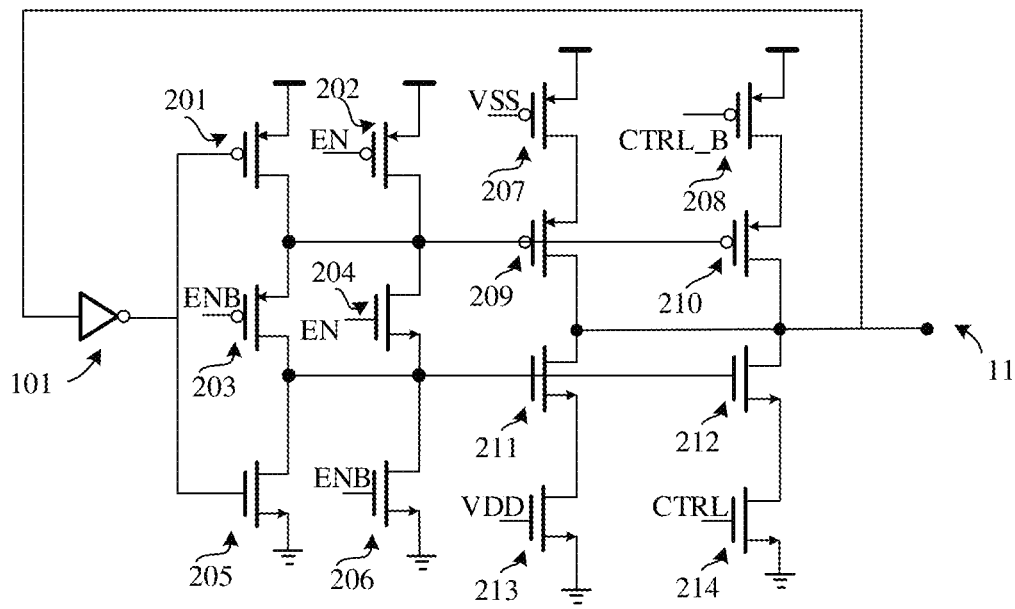
FIG. 3 is a schematic structural diagram of still another driving adjustment circuit according to at least one embodiment of the present disclosure.

In some embodiments, referring to FIG. 3, FIG. 3 shows a schematic structural diagram of still another driving adjustment circuit 10 according to at least one embodiment of the present disclosure. As shown in FIG. 3, the second NOT gate module 102 may include a first transistor 201, a second transistor 202, a third transistor 203, a fourth transistor 204, a fifth transistor 205, and a sixth transistor 206; wherein a first end of the first transistor 201 and a first end of the fifth transistor 205 are connected to the first adjustment signal (i.e., an output terminal of the first NOT gate module 101), a first end of the second transistor 202 and a first end of the fourth transistor 204 are connected to the first enable signal EN, and a first end of the third transistor 203 and a first end of the sixth transistor 206 are connected to the second enable signal ENB; a second end of the first transistor 201 is connected to a first power supply signal, a second end of the second transistor 202 is connected to a second power supply signal, and both a third end of the fifth transistor 205 and a third end of the sixth transistor 206 are connected to a ground signal; a third end of the first transistor 201, connected to a third end of the second transistor 202, a second end of the third transistor 203, and a second end of the fourth transistor, is used to output the second first adjustment signal; a third end of the third transistor 203, connected to a third end of the fourth transistor 204, a second end of the fifth transistor 205, and a second end of the sixth transistor 206, is used to output the second second adjustment signal.

In some embodiments, as shown in FIG. 3, the third NOT gate module 103 may include a seventh transistor 207, an eighth transistor 208, a ninth transistor 209, a tenth transistor 210, an eleventh transistor 211, a twelfth transistor 212, a thirteenth transistor 213, and a fourteenth transistor 214; a first end of the seventh transistor 207 is connected to the ground signal, a first end of the eighth transistor 208 is connected to the second control signal CTRL_B, a first end of the ninth transistor 209 and a first end of the tenth transistor 210 are connected to the second first adjustment signal, a first end of the eleventh transistor 211 and a first end of the twelfth transistor 212 are connected to the second second adjustment signal, a first end of the thirteenth transistor 213 is connected to a third power supply signal, and a first end of the fourteenth transistor 214 is connected to the first control signal CTRL; a second end of the seventh transistor 207 is connected to a fourth power supply signal, a second end of the eighth transistor 208 is connected to a fifth power supply signal, a second end of the ninth transistor 209 is connected to a third end of the seventh transistor 207, and a second end of the tenth transistor 210 is connected to a third end of the eighth transistor 208; a third end of the ninth transistor 209, a third end of the tenth transistor 210, a second end of the eleventh transistor 211, and a second end of the twelfth transistor 212 are connected to the signal terminal 11; a second end of the thirteenth transistor 213 is connected to a third end of the eleventh transistor 211, a second end of the fourteenth transistor 214 is connected to a third end of the twelfth transistor 212, and both a third end of the thirteenth transistor 213 and a third end of the fourteenth transistor 214 are connected to the ground signal.

Here, the input terminal of the first NOT gate module 101 is also connected to the signal terminal 11.

The first transistor 201, the second transistor 202, the third transistor 203, the seventh transistor 207, the eighth transistor 208, the ninth transistor 209, and the tenth transistor 210 are P-channel field effect transistors. The fourth transistor 204, the fifth transistor 205, the sixth transistor 206, the eleventh transistor 211, the twelfth transistor 212, the thirteenth transistor 213, and the fourteenth transistor 214 are N-channel field effect transistors.

In FIG. 3, a first end of the N-channel FET is a gate electrode, a second end of the N-channel FET is a drain electrode, and a third end of the N-channel FET is a source electrode. A first end of the P-channel FET is a gate electrode, a second end of the P-channel FET is a source electrode, and a third end of the P-channel FET is a drain electrode.

Further, the first power supply signal, the second power supply signal, the third power supply signal, the fourth power supply signal, and the fifth power supply signal may be the same or different, and need to be determined according to an actual application scenario.

At least one embodiment of the present disclosure provides a driving adjustment circuit. The driving adjustment circuit includes a first NOT gate module, a second NOT gate module, and a third NOT gate module that are sequentially connected, wherein an input terminal of the first NOT gate module and an output terminal of the third NOT gate module are connected to a signal terminal; wherein the first NOT gate module is configured to acquire a to-be-driven signal from the signal terminal and perform a NOT operation on the to-be-driven signal to obtain a first adjustment signal; the second NOT gate module is configured to, under the condition that the driving adjustment circuit is in an ON state, receive the first adjustment signal and performing the NOT operation on the first adjustment signal to obtain a second adjustment signal; the third NOT gate module is configured to receive the second adjustment signal and perform voltage adjustment processing on the to-be-driven signal at the signal terminal according to the second adjustment signal. In this way, by performing the voltage adjustment processing on the to-be-driven signal through the driving adjustment circuit, the signal transmission performance can be improved, the inter-symbol interference problem can be partially solved, and the data transmission rate can be improved. In addition, the ON or OFF state of the driving adjustment circuit can be controlled by the enable signal, and voltage adjustment capability of the driving adjustment circuit can be adjusted by the control signal, so that both the data transmission performance and the energy consumption are balanced.

Figure 4:
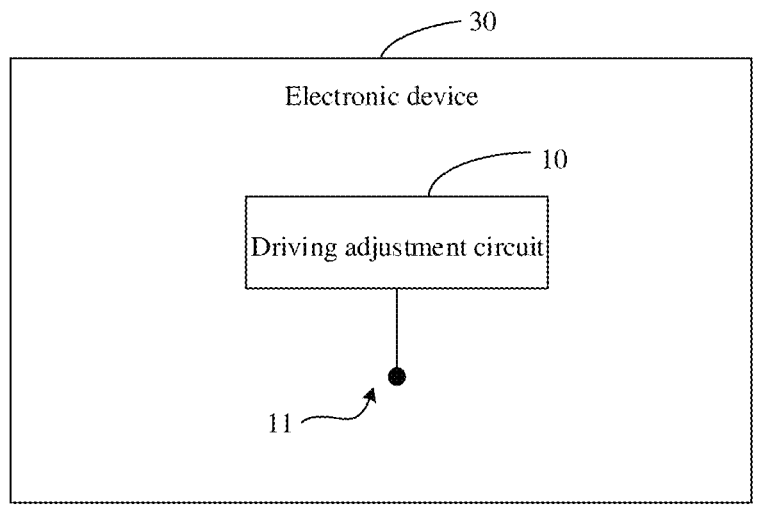
FIG. 4 is a schematic structural diagram of an electronic device according to at least one embodiment of the present disclosure.

In another embodiment of the present disclosure, referring to FIG. 4, FIG. 4 shows a schematic structural diagram of an electronic device 30 according to at least one embodiment of the present disclosure is shown. As shown in FIG. 4, the electronic device 30 may include a signal terminal 11 and a driving adjustment circuit 10.

It is to be noted that the electronic device 30 may be a smartphone, a tablet computer, a palmtop computer, a Mobile Terminal, or the like. The embodiments of the present disclosure are merely exemplified and do not constitute related limitations. The electronic device 30 includes the signal terminal 11 and the driving adjustment circuit 10 by which the signal at the signal terminal 11 can undergo the voltage adjustment processing, thereby improving the signal transmission performance. In addition, the ON or OFF of the driving adjustment circuit 10 can be controlled by the enable signal, and the voltage adjustment capability of the driving adjustment circuit 10 can be adjusted by the control signal, so that both the data transmission performance and the energy consumption are balanced.

Figure 5:
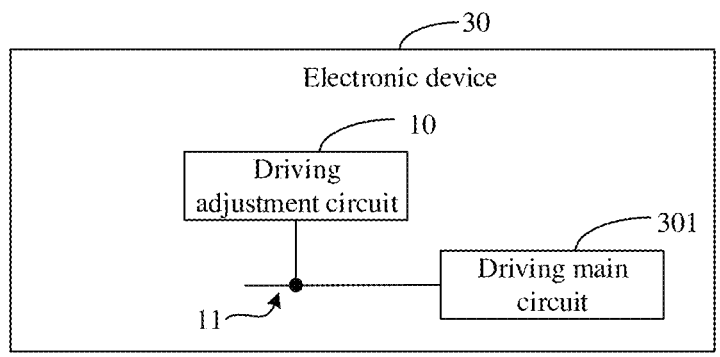
FIG. 5 is a schematic structural diagram of another electronic device according to at least one embodiment of the present disclosure.

In some embodiments, referring to FIG. 5, FIG. 5 shows a schematic structural diagram of another electronic device 30 according to at least one embodiment of the present disclosure. As shown in FIG. 5, the electronic device 30 further includes a driving main circuit 301, and an input terminal of the driving main circuit 301 is connected to the driving adjustment circuit 10 via the signal terminal 11. The driving main circuit 301 is configured to, when the driving adjustment circuit is in the OFF state, receive the to-be-driven signal from the signal terminal and perform driving processing on the to-be-driven signal to obtain a target transmission signal. Or the driving main circuit is configured to, when the driving adjustment circuit 10 is in the ON state, receive and perform the driving processing on the to-be-driven signal that has been processed through a voltage adjustment processing, so as to obtain the target transmission signal.

The driving adjustment circuit 10 is provided at the input terminal of the driving main circuit 301. The driving adjustment circuit 10 performs the voltage adjustment processing on the to-be-driven signal which enters into the driving main circuit 301, so as to improve the transmission performance of the to-be-driven signal.

Figure 6:
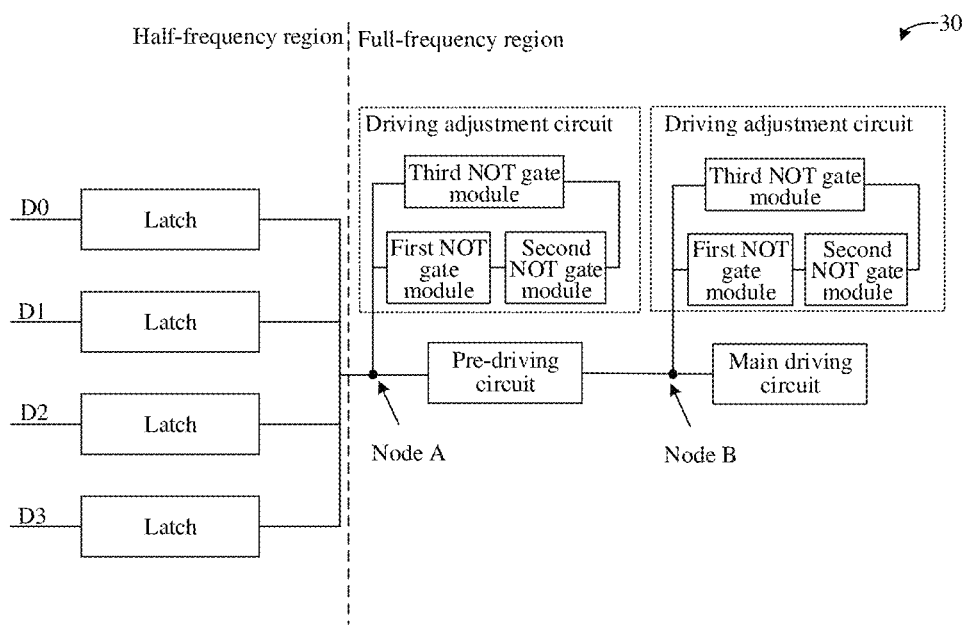
FIG. 6 is a schematic structural diagram of still another electronic device according to at least one embodiment of the present disclosure.

Referring to FIG. 6, FIG. 6 shows a schematic structural diagram of still another electronic device according to at least one embodiment of the present disclosure. There are a Half Frequency Domain and a Full Frequency Domain in the electronic device 30.

The half-frequency region includes at least 4-to-1 multiplexer (4-1 MUX). The 4-1 MUX is composed of four latches and an output module (not shown). The 4-1 MUX receives parallel data signals (D0, D1, D2, and D3) and outputs them in a serialized manner to obtain serial data signals.

The full-frequency region may include a pre-driving circuit and a main driving circuit. Here, an input terminal of the pre-driving circuit is referred to as Node A, and an input terminal of the main driving circuit is referred to as Node B. According to an actual application scenario, only the Node A is provided with one driving adjustment circuit, only the Node B is provided with one driving adjustment circuit, or each of the Node A and the Node B is provided with one driving adjustment circuit. In other words, any one of the Node A and the Node B can be determined as the signal terminal 11 described above according to actual use requirement.

In addition, the rate/amplitude of the voltage adjustment of the driving adjustment circuit can be adaptively adjusted according to the transmission rate of the electronic device so as to achieve the best effect at various transmission rates. In particular, in the case of a lower transmission rate, the driving adjustment circuit may also be turned off to save current and power consumption.

As shown in FIG. 6, each of the Node A and the Node B may be provided with one driving adjustment circuit. Each driving adjustment circuit includes a first NOT gate module, a second NOT gate module, and a third NOT gate module, and a specific structure of the first NOT gate module, the second NOT gate module, and the third NOT gate module is shown in FIG. 3. Here, the second NOT gate module further has a gating function for controlling the ON/OFF state of the driving adjustment circuit by receiving the enable signal (EN/ENB). The third NOT gate module further has an operation mode adjustment function for controlling the driving adjustment circuit to be in the first operation mode or the second operation mode by receiving the control signal (CTRL/CTRL_B). For explanation of the first operation mode and the second operation mode, refer to the foregoing.

Figure 7:
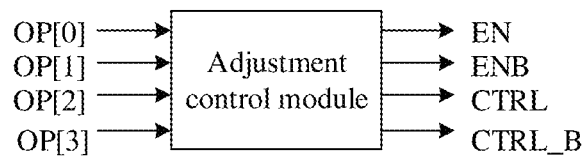
FIG. 7 is a schematic structural diagram of an adjustment control module according to at least one embodiment of the present disclosure.

Further, the electronic device 30 further includes a control module for determining the enable signal (EN/ENB) and the control signal (CTRL/CTRL_B). Referring to FIG. 7, FIG. 7 shows a schematic structural diagram of an adjustment control module according to at least one embodiment of the present disclosure. The adjustment control module receives the mode encoding signal (OP[3:0]) and outputs the enable signal (EN/ENB) and the control signal (CTRL/CTRL_B) according to the mode encoding signal.

Specifically, the mode encoding signal is related to a tCCD_L parameter (a parameter in the electronic device that indicates an operating frequency). Referring to Table 1, a correspondence between the mode encoding signal and the tCCD_L is shown.

TABLE 1

| Function | OP[3:0] | tCCD_L.min (nCK) | tCCD_WR2.min (nCK) | tCCD_WR.min (nCK) | tDLLK.min (nCK) | Details | Note |
|---|---|---|---|---|---|---|---|
| tCCD_L/ tCCD_L_WR/ tCCD_L.WR2/ tDLLK | 0000 | 8 | 16 | 32 | 1024 | 1980 MT/s ≤ Data Rate ≤ 2100 MT/s & 2933 MT/s ≤ Data Rate ≤ 3200 MT/s | 1, 2, 3 |
| | 0001 | 9 | 18 | 36 | 1024 | 3200 MT/s < Data Rate ≤ 3600 MT/s | |
| | 0010 | 10 | 20 | 40 | 1280 | 3600 MT/s < Data Rate ≤ 4000 MT/s | |
| | 0011 | 11 | 22 | 44 | 1280 | 4000 MT/s < Data Rate ≤ 4400 MT/s | |
| | 0100 | 12 | 24 | 48 | 1536 | 4400 MT/s < Data Rate ≤ 4800 MT/s | |
| | 0101 | 13 | 26 | 52 | 1536 | 4800 MT/s < Data Rate ≤ 5200 MT/s | |
| | 0110 | 14 | 28 | 56 | 1792 | 5200 MT/s < Data Rate ≤ 5600 MT/s | |
| | 0111 | 15 | 30 | 60 | 1792 | 5600 MT/s < Data Rate ≤ 6000 MT/s | |

TABLE 1-continued

| Function | OP[3:0] | tCCD_L.min (nCK) | tCCD_WR2.min (nCK) | tCCD_WR.min (nCK) | tDLLK.min (nCK) | Details | Note |
|---|---|---|---|---|---|---|---|
| | 1000 | 16 | 32 | 64 | 2048 | 6000 MT/s < Data Rate ≤ 6400 MT/s | |
| | 1001 ... 1111 | | | All other encodings Reserved | | | |

In particular, Table 1 comes from SPEC part of the DRAM DDR5, and the meanings of the nouns can be found in the DDR5 document, and the meanings of related parameters do not affect the understanding of the embodiments of the present disclosure, so details are not described herein.

That is, in DDR5, there is a selection signal OP[3:0] of the tCCD_L for defining the operating frequency of the electronic device. In the present embodiment, the OP[3:0] is also used as a mode selection signal to determine the operation mode of the driving adjustment circuit.

Specifically, if the transmission rate (Data Rate) of the electronic device is ≤4800 Mbps, encoding of the OP[3:0] at this time is a third type of encoding, including the following cases: 0000, 0001, 0010, 0011, and 0100. At this time, EN=L (i.e., the logic "0"), ENB=H (i.e., the logic "1"), and the driving adjustment circuit is turned off. It should be understood that in this case, a level of the CTRL/CTRL_B does not affect a state of the driving adjustment circuit and may be self-defined.

If 4800 Mbps<Data Rate≤5600 Mbps, the encoding of OP[3:0] at this time is a second type of encoding, including the following cases: 0101 and 0110. At this time, EN=H and ENB=L, the driving adjustment circuit is turned on; and CTRL=L, CTRL_B=H, and the driving adjustment circuit enters the second operation mode and performs the voltage adjustment processing at a lower rate and a smaller amplitude, that is, the driving adjustment circuit does not need to enable maximum adjustment capability.

If Data Rate>5600 Mbps, the encoding of the OP[3:0] at this time is a first type of encoding, including the following cases: 0111 and 1000. At this time, EN=H, ENB=L, and the driving adjustment circuit is turned on; and CTRL=H, CTRL_B=L, and the driving adjustment circuit enters the first operation mode and performs the voltage adjustment processing at a higher rate and a larger amplitude, that is, the driving adjustment circuit enables the maximum adjustment capability to improve the signal transmission performance.

At least one embodiment of the present disclosure provides an electronic device including a signal terminal and the aforementioned driving adjustment circuit. In this way, by performing voltage adjustment processing on a to-be-driven signal through the driving adjustment circuit, the signal transmission performance can be improved, the inter-symbol interference problem can be partially solved, and the data transmission rate can be improved. In addition, the ON or OFF state of the driving adjustment circuit can be controlled by the enable signal, and the voltage adjustment capability of the driving adjustment circuit can be adjusted by the control signal, so that both the data transmission performance and the energy consumption are balanced.

Figure 8:
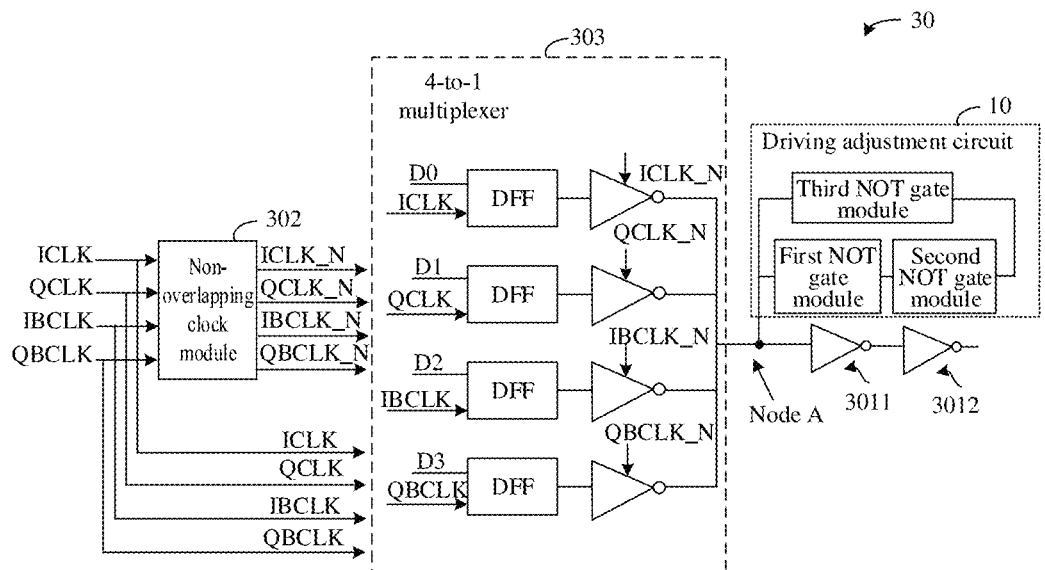
FIG. 8 is a schematic structural diagram of still another electronic device according to at least one embodiment of the present disclosure.

In still another embodiment of the present disclosure, referring to FIG. 8, FIG. 8 shows a schematic structural diagram of still another electronic device 30 according to at least one embodiment of the present disclosure. The electronic device 30 includes a non-overlapping clock module 302, a 4-to-1 multiplexer 303, a pre-driving circuit 3011, and a main driving circuit 3012. The 4-to-1 multiplexer 303 is composed of a memory module and an output module, wherein the memory module includes four D-type flip-flops (DFF, which performs a function of a register) and the output module includes four inverters. Meanwhile, the driving adjustment circuit 10 is provided at a place (Node A) before the pre-driving circuit 3011. The Node A corresponds to the signal terminal 11, and the pre-driving circuit 3011 and the main driving circuit 3012 correspond to the driving main circuit 301.

Specifically, the non-overlapping clock module 302 receives four non-overlapping clock signals: ICLK, QCLK, IBCLK, and QBCLK, and the phases of ICLK, QCLK, IBCLK, and QBCLK are different. Based on the received signal, the non-overlapping clock module 302 generates ICLK_N, QCLK_N, IBCLK_N, and QBCLK_N. Then, ICLK, QCLK, IBCLK and QBCLK are respectively used as clock signals of flip-flops in the 4-to-1 multiplexer 303, and ICLK_N, QCLK_N, IBCLK_N and QBCLK_N are respectively used as gate signals of the inverters in the 4-to-1 multiplexer 303. Finally, the parallel data signals (D0, D1, D2 and D3) are converted into serial data signals. The driving adjustment circuit 10 performs the voltage adjustment processing on the serial data signals to improve the transmission performance. The adjusted serial data signals undergo the pre-driving circuit 3011 and the main driving circuit 3012 in sequence to obtain the target transmission signal for further backward transmission.

According to the circuit configuration shown in FIG. 8, when the transmission rate of the electronic device is 5600 Mbps, the driving adjustment circuit 10 is in the first operation state, that is, the voltage pull-up processing/the voltage pull-down processing is performed at a higher rate and a larger amplitude, and the results of a simulation experiment are given below.

Figure 9:
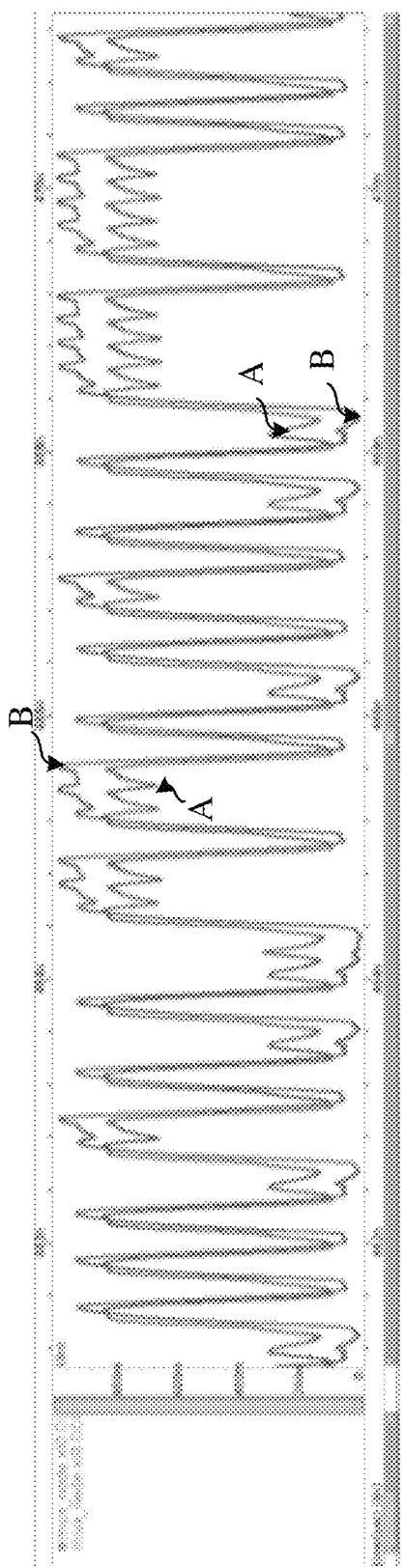
FIG. 9 is a schematic diagram of signal variation of an Node A according to at least one embodiment of the present disclosure.
Figure 10:
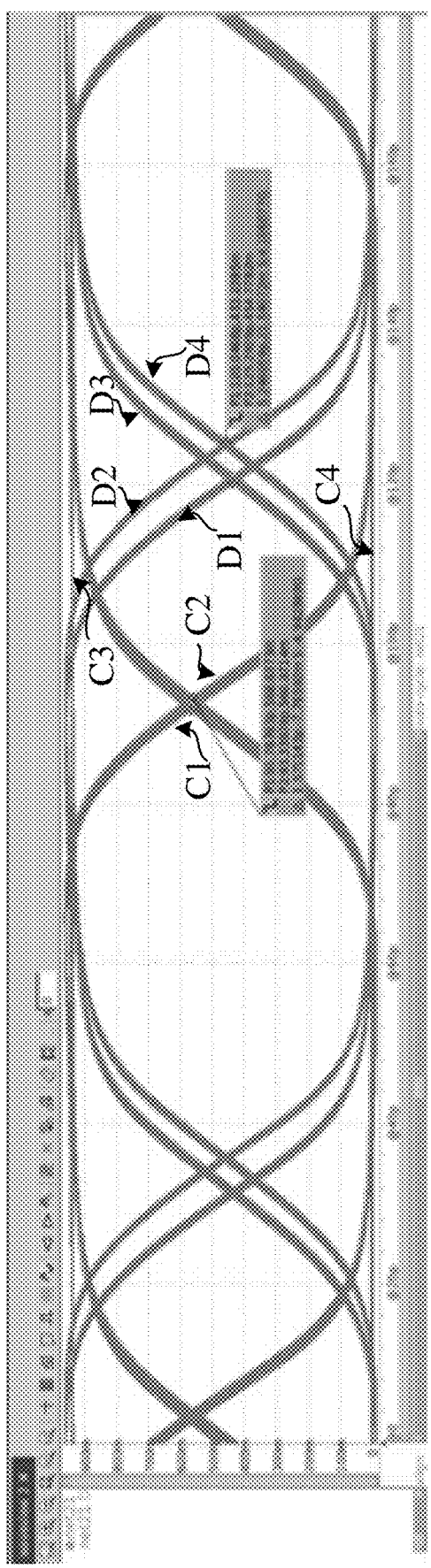
FIG. 10 is a schematic diagram of an output signal of a pseudo-random bit sequence according to at least one embodiment of the present disclosure.

Referring to FIG. 9, FIG. 9 shows a schematic diagram of signal variation of a Node A according to at least one embodiment of the present disclosure. In FIG. 9, a curve A is a result of turning on the driving adjustment circuit 10, and a curve B is a result of turning off the driving adjustment circuit 10. Referring to FIG. 10, FIG. 10 shows a schematic diagram of an output signal of a Pseudo Random Bit Sequence. In FIG. 10, a curve C1~C4 is a result of turning on the driving adjustment circuit, and a curve D1~D4 is a result of turning off the driving adjustment circuit 10.

As shown in FIG. 9, after turning on the driving adjustment circuit 10, a voltage of the logic "1" signal is reduced, and a voltage of the logic "0" signal is increased. As shown in FIG. 10, a signal jitter is 4.2 picoseconds before the driving adjustment circuit 10 is turned on, and the signal jitter is reduced to 1.6 picoseconds after the driving adjustment circuit 10 is turned on. That is, by the voltage adjustment of the driving adjustment circuit 10, the magnitude of the voltage value in the signal can be changed, the signal jitter can be reduced, the signal transmission performance and the signal quality can be improved, the inter-symbol interference problem occurring in a high frequency state of the electronic device can be solved, and the electronic device is expected to have a higher operating frequency.

The embodiment of the present disclosure provides an electronic device. With further explanation of the foregoing embodiment in the embodiment of the present disclosure, it can be seen that the driving adjustment circuit can perform drive enhancement processing on the signal in the transmission process to improve the signal transmission performance, thereby partially solving the inter-symbol interference problem and increasing the data transmission rate.

At least one embodiment of the present disclosure provides a driving adjustment circuit and an electronic device. The driving adjustment circuit includes a first NOT gate module, a second NOT gate module, and a third NOT gate module that are sequentially connected, wherein an input terminal of the first NOT gate module and an output terminal of the third NOT gate module are connected to a signal terminal; wherein the first NOT gate module is configured to acquire a to-be-driven signal from the signal terminal and perform a NOT operation on the to-be-driven signal to obtain a first adjustment signal; the second NOT gate module is configured to, under the condition that the driving adjustment circuit is in an ON state, receive the first adjustment signal and perform the NOT operation on the first adjustment signal to obtain a second adjustment signal; the third NOT gate module is configured to receive the second adjustment signal and performing voltage adjustment processing on the to-be-driven signal at the signal terminal according to the second adjustment signal. Thus, by performing the voltage adjustment processing on the to-be-driven signal, signal transmission performance can be improved, an inter-symbol interference problem can be partially solved, and a data transmission rate can be improved.

The foregoing is merely a preferred embodiment of the present disclosure, and is not intended to limit the scope of protection of the present disclosure.

It is to be noted that, in the present disclosure, the term "include", "comprise", or any other variant thereof is intended to cover non-exclusive inclusions such that a process, method, article, or device that includes a series of elements includes not only those elements, but also other elements not specifically listed, or elements inherent to such a process, method, article, or device. Under the condition that there are no more limitations, the element limited by "including one . . . " does not exclude that the process, method, article, or device, which includes the element, further includes other same elements.

The above description of the embodiment of the present disclosure is merely for description, and does not represent the advantages or disadvantages of the embodiment.

The methods disclosed in the several method embodiments provided herein may be arbitrarily combined without conflict to obtain new method embodiments.

The features disclosed in the several product embodiments provided herein can be arbitrarily combined without conflict to obtain new product embodiments.

The features disclosed in the several method or device embodiments provided herein may be arbitrarily combined without conflict to obtain new method or device embodiments.

The foregoing is merely a specific embodiment of the present disclosure, but the scope of protection of the present disclosure is not limited thereto. Any change or replacement readily contemplated by a person skilled in the art within the technical scope disclosed herein shall fall within the scope of protection of the present disclosure. Accordingly, the scope of protection of the present disclosure shall be subject to the scope of protection of the claims.

The invention claimed is:

1. A driving adjustment circuit, comprising a first NOT gate module, a second NOT gate module, and a third NOT gate module that are sequentially connected, wherein an input terminal of the first NOT gate module and an output terminal of the third NOT gate module are connected to a signal terminal; wherein
   the first NOT gate module is configured to acquire a to-be-driven signal from the signal terminal and perform a NOT operation on the to-be-driven signal to obtain a first adjustment signal;
   the second NOT gate module is configured to, under the condition that the driving adjustment circuit is in an ON state, receive the first adjustment signal and perform the NOT operation on the first adjustment signal to obtain a second adjustment signal; and
   the third NOT gate module is configured to receive the second adjustment signal and perform voltage adjustment processing on the to-be-driven signal at the signal terminal according to the second adjustment signal.

2. The driving adjustment circuit of claim 1, wherein the second NOT gate module is further configured to receive an enable signal and control the driving adjustment circuit to be in the ON state or in an OFF state according to the enable signal.

3. The driving adjustment circuit of claim 2, wherein the enable signal comprises a first enable signal and a second enable signal; the second NOT gate module is further configured to control the driving adjustment circuit to be in the ON state when the first enable signal is within a first level range and the second enable signal is within a second level range, or control the driving adjustment circuit to be in the OFF state when the first enable signal is within the second level range and the second enable signal is within the first level range.

4. The driving adjustment circuit of claim 3, wherein the third NOT gate module is specifically configured to perform voltage pull-down processing on a first voltage value to obtain a second voltage value, and perform voltage pull-up processing on a third voltage value to obtain a fourth voltage value; wherein the first voltage value and the second voltage value are both within the first level range, the second voltage value is less than the first voltage value, the third voltage value and the fourth voltage value are both within the second level range, the fourth voltage value is greater than the third voltage value, and each voltage value within the first level range is greater than any voltage value within the second level range.

5. The driving adjustment circuit of claim 4, wherein the third NOT gate module is further configured to receive a control signal and perform a first voltage pull-down processing on the first voltage value and a first voltage pull-up processing on the third voltage value according to the control signal, or perform a second voltage pull-down processing on the first voltage value and a second voltage pull-up processing on the third voltage value according to the control signal; wherein a voltage pull-down rate in the first voltage pull-down processing is greater than a voltage pull-down rate in the second voltage pull-down processing, and a voltage pull-up rate in the first voltage pull-up processing is greater than a voltage pull-up rate in the second voltage pull-up processing.

6. The driving adjustment circuit of claim 5, wherein the control signal comprises a first control signal and a second control signal, and the third NOT gate module comprises a first pull-down circuit and a second pull-down circuit; wherein the third NOT gate module is further configured to, under the condition that the first control signal is within the first level range and the second control signal is within the second level range, perform the first voltage pull-down processing on the first voltage value through the first pull-down circuit and the second pull-down circuit to obtain the second voltage value; or the third NOT gate module is further configured to, under the condition that the first control signal is within the second level range and the second control signal is within the first level range, perform the second voltage pull-down processing on the first voltage value through the first pull-down circuit to obtain the second voltage value.

7. The driving adjustment circuit of claim 6, wherein the third NOT gate module further comprises a first pull-up circuit and a second pull-up circuit; wherein the third NOT gate module is further configured to, under the condition that the first control signal is within the first level range and the second control signal is within the second level range, perform the first voltage pull-up processing on the third voltage value through the first pull-up circuit and the second pull-up circuit to obtain the fourth voltage value; or the third NOT gate module is further configured to, under the condition that the first control signal is within the second level range and the second control signal is within the first level range, perform the second voltage pull-up processing on the third voltage value through the first pull-up circuit to obtain the fourth voltage value.

8. The driving adjustment circuit of claim 7, wherein the first NOT gate module is specifically configured to output the first adjustment signal within the second level range under the condition that the to-be-driven signal is within the first level range, or output the first adjustment signal within the first level range under the condition that the to-be-driven signal is within the second level range.

9. The driving adjustment circuit of claim 8, wherein the second adjustment signal comprises a second first adjustment signal and a second second adjustment signal; the second NOT gate module is further configured to, when the driving adjustment circuit is in the ON state, receive the first adjustment signal within the first level range and output the second first adjustment signal within the second level range and the second second adjustment signal within the second level range; or the second NOT gate module is further configured to, when the driving adjustment circuit is in the ON state, receive the first adjustment signal within the second level range and output the second first adjustment signal within the first level range and the second second adjustment signal within the first level range.

10. The driving adjustment circuit of claim 9, wherein the third NOT gate module is further configured to, when the second first adjustment signal within the first level range and the second second adjustment signal within the first level range are received, determine a voltage of the to-be-driven signal as the first voltage value; or the third NOT gate module is further configured to, when the second first adjustment signal within the second level range and the second second adjustment signal within the second level range are received, determine the voltage of the to-be-driven signal as the third voltage value.

11. The driving adjustment circuit of claim 10, wherein the driving adjustment circuit further comprises an adjustment control module; and the adjustment control module is configured to receive a mode encoding signal and output the first enable signal, the second enable signal, the first control signal, and the second control signal according to the mode encoding signal.

12. The driving adjustment circuit of claim 11, wherein the mode encoding signal comprises a first type of encoding signal, and the first type of encoding signal is used to indicate that a data transmission rate of an electronic device is greater than a first transmission threshold value;
the adjustment control module is configured to, when the first type of encoding signal is received, control the first enable signal to be within the first level range and the second enable signal to be within the second level range to control the driving adjustment circuit to be in the ON state; and the adjustment control module is configured to control the first control signal to be within the first level range and the second control signal to be within the second level range, such that the driving adjustment circuit performs the first voltage pull-down processing or the first voltage pull-up processing.

13. The driving adjustment circuit of claim 11, wherein the mode encoding signal comprises a second type of encoding signal, and the second type of encoding signal is used to indicate that a data transmission rate of an electronic device is greater than a second transmission threshold value and less than or equal to a first transmission threshold value;
the adjustment control module is configured to, when the second type of encoding signal is received, control the first enable signal to be within the first level range and the second enable signal to be within the second level range to control the driving adjustment circuit to be in the ON state; and the adjustment control module is configured to control the first control signal to be within the second level range and the second control signal to be within the first level range, such that the driving adjustment circuit performs the second voltage pull-down processing or the second voltage pull-up processing on the to-be-driven signal.

14. The driving adjustment circuit of claim 13, wherein the first transmission threshold value is 5,600 megabits per second and the second transmission threshold value is 4,800 megabits per second.

15. The driving adjustment circuit of claim 11, wherein the mode encoding signal comprises a third type of encoding signal, and the third type of encoding signal is used to indicate that a data transmission rate of an electronic device is less than or equal to a second transmission threshold value;
the adjustment control module is configured to, when the third type of encoding signal is received, control the first enable signal to be within the second level range and the second enable signal to be within the first level range to control the driving adjustment circuit to be in the OFF state.

16. The driving adjustment circuit of claim 10, wherein the second NOT gate comprises a first transistor, a second transistor, a third transistor, a fourth transistor, a fifth transistor, and a sixth transistor;
a first end of the first transistor and a first end of the fifth transistor are connected to the first adjustment signal, a first end of the second transistor and a first end of the fourth transistor are connected to the first enable signal, and a first end of the third transistor and a first end of the sixth transistor are connected to the second enable signal;
a second end of the first transistor is connected to a first power supply signal, a second end of the second transistor is connected to a second power supply signal, and both a third end of the fifth transistor and a third end of the sixth transistor are connected to a ground signal;
a third end of the first transistor is connected to a third end of the second transistor, a second end of the third transistor, and a second end of the fourth transistor, and is used to output the second first adjustment signal; and
a third end of the third transistor is connected to a third end of the fourth transistor, a second end of the fifth transistor, and a second end of the sixth transistor, and is used to output the second second adjustment signal.

17. The driving adjustment circuit of claim 16, wherein the third NOT gate comprises a seventh transistor, an eighth transistor, a ninth transistor, a tenth transistor, an eleventh transistor, a twelfth transistor, a thirteenth transistor, and a fourteenth transistor;
a first end of the seventh transistor is connected to the ground signal, a first end of the eighth transistor is connected to the second control signal, a first end of the ninth transistor and a first end of the tenth transistor are connected to the second first adjustment signal, a first end of the eleventh transistor and a first end of the twelfth transistor are connected to the second second adjustment signal, a first end of the thirteenth transistor is connected to a third power supply signal, and a first end of the fourteenth transistor is connected to the first control signal;
a second end of the seventh transistor is connected to a fourth power supply signal, a second end of the eighth transistor is connected to a fifth power supply signal, a second end of the ninth transistor is connected to a third end of the seventh transistor, and a second end of the tenth transistor is connected to a third end of the eighth transistor;
a third end of the ninth transistor, a third end of the tenth transistor, a second end of the eleventh transistor, and a second end of the twelfth transistor are connected to the signal terminal; and
a second end of the thirteenth transistor is connected to a third end of the eleventh transistor, a second end of the fourteenth transistor is connected to a third end of the twelfth transistor, and both a third end of the thirteenth transistor and a third end of the fourteenth transistor are connected to the ground signal.

18. The driving adjustment circuit of claim 17, wherein the first transistor, the second transistor, the third transistor, the seventh transistor, the eighth transistor, the ninth transistor, and the tenth transistor are P-channel field effect transistors; the fourth transistor, the fifth transistor, the sixth transistor, the eleventh transistor, the twelfth transistor, the thirteenth transistor, and the fourteenth transistor are N-channel field effect transistors;
wherein a first end of each N-channel field effect transistor is a gate electrode, a second end of each N-channel field effect transistor is a drain electrode, and a third end of each N-channel field effect transistor is a source electrode; a first end of each P-channel field effect transistor is a gate electrode, a second end of each P-channel field effect transistor is a source electrode, and a third end of each P-channel field effect transistor is a drain electrode.

19. An electronic device, wherein the electronic device comprises a signal terminal and a driving adjustment circuit, the driving adjustment circuit comprises a first NOT gate module, a second NOT gate module, and a third NOT gate module that are sequentially connected, wherein an input terminal of the first NOT gate module and an output terminal of the third NOT gate module are connected to a signal terminal; wherein
the first NOT gate module is configured to acquire a to-be-driven signal from the signal terminal and perform a NOT operation on the to-be-driven signal to obtain a first adjustment signal;
the second NOT gate module is configured to, under the condition that the driving adjustment circuit is in an ON state, receive the first adjustment signal and perform the NOT operation on the first adjustment signal to obtain a second adjustment signal; and
the third NOT gate module is configured to receive the second adjustment signal and perform voltage adjustment processing on the to-be-driven signal at the signal terminal according to the second adjustment signal.

20. The electronic device of claim 19, wherein the electronic device further comprises a driving main circuit, and an input terminal of the driving main circuit is connected to the driving adjustment circuit via the signal terminal;
the driving main circuit is configured to, when the driving adjustment circuit is in an OFF state, receive a to-be-driven signal from the signal terminal and perform driving processing on the to-be-driven signal to obtain a target transmission signal; or the driving main circuit is configured to, when the driving adjustment circuit is in an ON state, receive the to-be-driven signal that has been processed through a voltage adjustment processing and perform the driving processing on the to-be-driven signal to obtain the target transmission signal.

* * * * *